(12) United States Patent
Endo et al.

(10) Patent No.: US 7,871,759 B2
(45) Date of Patent: Jan. 18, 2011

(54) BARRIER FILM MATERIAL AND PATTERN FORMATION METHOD USING THE SAME

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 494 days.

(21) Appl. No.: 11/949,338

(22) Filed: Dec. 3, 2007

(65) Prior Publication Data

US 2008/0193883 A1    Aug. 14, 2008

(30) Foreign Application Priority Data

Feb. 8, 2007    (JP) .............................. 2007-028930

(51) Int. Cl.
*G03F 7/26* (2006.01)

(52) U.S. Cl. ...................................... 430/311; 430/961

(58) Field of Classification Search ................. 430/311, 430/961

See application file for complete search history.

(56) References Cited

U.S. PATENT DOCUMENTS

2006/0105272 A1 *   5/2006   Gallagher et al. ........... 430/311

OTHER PUBLICATIONS

Switkes et al. "Immersion lithography at 157 nm", J. Vac. Sci. Technol. vol. 19(6), Nov./Dec. 2001, pp. 2353-2356.
Smith et al. "Approaching the numerical aperture of water—Immersion lithography at 193 nm", Optical Microlithography XVII, Proceedings of SPIE vol. 5377, pp. 273-284, 2004.

* cited by examiner

*Primary Examiner*—Kathleen Duda
(74) *Attorney, Agent, or Firm*—McDermott Will & Emery LLP

(57) ABSTRACT

A resist film is formed on a substrate, and a barrier film including a compound whose alkali-insoluble property is changed to an alkali-soluble property through molecular structure change caused by an alkaline solution is formed on the resist film. Thereafter, with an immersion liquid provided on the barrier film, pattern exposure is performed by selectively irradiating the resist film through the barrier film with exposing light. After the pattern exposure, the barrier film is removed and the resist film is developed. Thus, a resist pattern made of the resist film is formed.

17 Claims, 12 Drawing Sheets

BARRIER FILM MATERIAL AND PATTERN FORMATION METHOD USING THE SAME

CROSS-REFERENCE TO RELATED APPLICATIONS

This application claims priority under 35 U.S.C. §119 on Patent Application No. 2007-28930 filed in Japan on Feb. 8, 2007, the entire contents of which are hereby incorporated by reference.

BACKGROUND OF THE INVENTION

The present invention relates to a material for a barrier film formed on a resist film for use in fabrication process or the like for semiconductor devices and a pattern formation method using the same.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like. Furthermore, use of $F_2$ laser lasing at a shorter wavelength has been examined, but since there are a large number of problems in exposure systems and resist materials, the development in the use of the $F_2$ laser is now being suspended.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid (an immersion solution) having a refractive index n (whereas n>1) and therefore, the NA (the numerical aperture) of the exposure system has a value n·NA. As a result, the resolution of the resist film can be improved. Also, use of an acidic solution as the immersion solution has been recently proposed for further improving the refractive index of the liquid (see, for example, B. W. Smith, A. Bourov, Y. Fan, L. Zavyalova, N. Lafferty, F. Cropanese, "Approaching the numerical aperture of water—Immersion Lithography at 193 nm", Proc. SPIE, Vol. 5377, p. 273 (2004)).

Now, a conventional pattern formation method employing the immersion lithography will be described with reference to FIGS. 12A through 12D, 13A and 13B.

First, a positive resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.05 g Quencher: triethanolamine . . . 0.002 g Solvent: propylene glycol monomethyl ether acetate . . . 20 g Next, as shown in FIG. 12A, the aforementioned resist material is applied on a substrate 601 so as to form a resist film 602 with a thickness of 0.35 µm.

Then, as shown in FIG. 12B, by using a barrier film material having the following composition, a barrier film 603 is formed on the resist film 602:

Base polymer: polyvinyl hexafluoroisopropyl alcohol . . . 1 g

Solvent: n-butyl alcohol . . . 20 g

Next, as shown in FIG. 12C, the resultant barrier film 603 is annealed with a hot plate at a temperature of 120° C. for 90 seconds, so as to improve the denseness of the barrier film 603.

Then, as shown in FIG. 12D, with an immersion liquid 605 of water provided on the annealed barrier film 603 by, for example, a puddle method, pattern exposure is carried out by irradiating the resist film 602 through the barrier film 603 with exposing light 607 of ArF excimer laser with NA of 0.68 having passed through a mask 606.

After the pattern exposure, as shown in FIG. 13A, the resist film 602 is baked with a hot plate at a temperature of 105° C. for 60 seconds (post exposure bake).

Next, the barrier film 603 is removed by using a 2.38 wt % tetramethylammonium hydroxide aqueous solution (an alkaline developer) and the resultant resist film is developed. In this manner, a resist pattern 602a made of an unexposed portion of the resist film 602 and having a line width of 0.09 µm is formed as shown in FIG. 13B.

However, as shown in FIG. 13B, the resist pattern 602a obtained by the conventional pattern formation method is in a defective shape.

The present inventors have variously examined the reason why the resist pattern formed by the conventional immersion lithography is in a defective shape, resulting in finding the following: In the case where the barrier film 603 cannot be sufficiently dissolved in a developer such as an alkaline aqueous solution, the development of the resist film 602 is inhibited and hence the resist film 602 cannot be uniformly developed. As a result, the resist pattern is formed in a defective shape.

When the resist pattern 602a in such a defective shape is used for etching a target film, the resultant pattern of the target film is also in a defective shape, which disadvantageously lowers the productivity and the yield in the fabrication process for semiconductor devices.

SUMMARY OF THE INVENTION

In consideration of the aforementioned conventional problem, an object of the invention is forming a fine resist pattern in a good shape by improving the solubility, attained in development, of a barrier film used for preventing the influence on a resist film of an immersion liquid used in the immersion lithography.

The present inventors have found, based on the results of the aforementioned examinations, that the solubility of a barrier film in an alkaline solution is improved by including, in a barrier film material, a compound whose alkali-insoluble property is changed to an alkali-soluble property through molecular structure change caused by an alkaline solution, or a polymer of the compound.

The present invention was devised on the aforementioned finding and is specifically practiced as follows:

The barrier film material of this invention used for forming a barrier film provided between a resist film and a liquid in exposing the resist film with the liquid provided on the resist film, includes a compound whose alkali-insoluble property is changed to an alkali-soluble property through molecular structure change caused by an alkaline solution.

According to the barrier film material of this invention, the barrier film including a compound whose alkali-insoluble property is changed to an alkali-soluble property through the molecular structure change caused by an alkaline solution is alkali-insoluble before development with an alkaline solution, and therefore, it functions as a barrier film for preventing permeation of water. On the other hand, this compound is changed to be alkali-soluble through the molecular structure change caused in the alkali development, and therefore, the alkali-soluble property of the barrier film is improved.

In the barrier film material of this invention, a compound is changed to be alkali-soluble through the molecular structure change caused by an alkaline solution is preferably a polymer.

When a polymer is thus used as the compound whose alkali-insoluble property is changed to an alkali-soluble property through the molecular structure change caused by an alkaline solution, the permeation of the liquid can be prevented by the whole barrier film. Furthermore, the alkali-soluble property of the barrier film is increased for the following reason: When a compound changed to be alkali-soluble through the molecular structure change is used, the compound is interspersed in the barrier film. On the contrary, when a polymer having a repeating unit is used as the compound, the polymer is present as a mass in the barrier film. As a result, the hydrophobic property can be more largely improved by using, as the compound changed to be alkali-soluble by an alkaline solution through the molecular structure change, a polymer than by using a compound not having a repeating unit.

Also, when the polymer is used as the compound changed to be alkali-soluble through the molecular structure change caused by an alkaline solution, since the polymer is present as a mass in the barrier film, the polymer can be dissolved in an alkaline solution at once. As a result, the alkali-soluble property can be improved. On the contrary, when a compound not having a repeating unit is used, since the compound is dissolved in an alkaline solution in a scattered manner in the barrier film, the alkali-soluble property of the barrier film is not largely improved as in using the polymer.

In the barrier film material of this invention, the compound preferably has an ester structure.

In this case, the ester structure is preferably lactone.

In this case, the lactone can be γ-butyrolactone, δ-valerolactone, δ-pentalactone, ε-caprolactone or mevalonic lactone.

In the barrier film material of this invention, polyvinyl alcohol, polyacrylic acid or polyvinyl hexafluoroisopropyl alcohol can be used as a base polymer of the barrier film.

At this point, the change in the compound of the alkali-insoluble property to the alkali-soluble property through the molecular structure change caused by an alkaline solution will be described by using a general formula.

For example, lactone, that is, an ester, usable as the compound changed to be alkali-soluble through the molecular structure change caused by an alkaline solution is opened in its ring by an alkaline solution as shown in a general formula of Chemical Formula 1 below so as to generate a carboxylate group (—COOH), and hence, it is changed to be alkali-soluble. In this manner, according to the present invention, the compound is not changed to be alkali-soluble until the molecular structure is changed. Since an alkali-soluble group thus appears through the change of the molecular structure itself in this invention, the alkali-solubility is much larger as compared with the case where a compound is changed to be alkali-soluble by providing polarity through hydration or the like.

Chemical Formula 1:

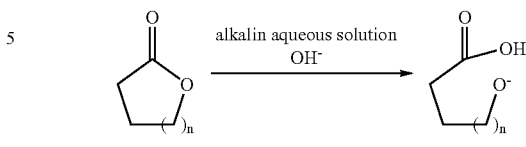

The first pattern formation method of this invention includes the steps of forming a resist film on a substrate; forming, on the resist film, a barrier film including a compound whose alkali-insoluble property is changed to an alkali-soluble property through molecular structure change caused by an alkaline solution; performing pattern exposure by selectively irradiating the resist film through the barrier film with exposing light with a liquid provided on the barrier film; removing the barrier film after the pattern exposure; and forming a resist pattern made of the resist film by developing the resist film.

The second pattern formation method of this invention includes the steps of forming a resist film on a substrate; forming, on the resist film, a barrier film including a compound whose alkali-insoluble property is changed to an alkali-soluble property through molecular structure change caused by an alkaline solution; performing pattern exposure by selectively irradiating the resist film through the barrier film with exposing light with a liquid provided on the barrier film; and removing the barrier film and forming a resist pattern made of the resist film by developing the resist film after the pattern exposure.

According to the first or second pattern formation method, the barrier film including the compound whose alkali-insoluble property is changed to an alkali-soluble property through the molecular structure change caused by an alkaline solution is formed on the resist film before the pattern exposure, and therefore, the barrier film keeps its alkali-insoluble property before the alkali development because its molecular structure is not changed yet, and hence the permeation of water is prevented. On the other hand, this compound is changed to be alkali-soluble through the molecular structure change caused in the alkali development, and therefore, the alkali-soluble property of the barrier film is improved. As a result, the resist pattern made of the resist film is formed in a good shape.

At this point, the first pattern formation method and the second pattern formation method are different from each other as follows: In the first pattern formation method, the barrier film formed on the resist film is removed before the development. On the other hand, in the second pattern formation method, the barrier film formed on the resist film is removed with a developer during the development. In the first pattern formation method, the barrier film is removed before the development, and hence, the development is proceeded in a general manner. In the second pattern formation method, the barrier film is removed during the development, and hence, the dissolution characteristic of the resist film can be controlled, so as to attain an effect to improve the dissolution characteristic of the resist. The control of the dissolution characteristic will be described later.

In the first or second pattern formation method, the compound included in the barrier film is preferably a polymer.

In the first or second pattern formation method, the compound included in the barrier film preferably has an ester structure.

In this case, the ester structure is preferably lactone.

In this case, the lactone can be γ-butyrolactone, δ-valerolactone, δ-pentalactone, ε-caprolactone or mevalonic lactone.

In the first or second pattern formation method, polyvinyl alcohol, polyacrylic acid or polyvinyl hexafluoroisopropyl alcohol can be used as a base polymer of the barrier film.

The first or second pattern formation method preferably further includes a step of annealing the barrier film between the step of forming a barrier film and the step of performing pattern exposure.

Thus, the denseness of the barrier film is so improved that the insolubility in an immersion liquid can be further improved. When the denseness of the barrier film is excessively improved, it is difficult to dissolve the barrier film for removal, and hence, the annealing should be performed at a temperature in an appropriate range. The appropriate range of the temperature at which the barrier film is annealed is not less than 100° C. and not more than 150° C., which does not limit the invention.

In the first or second pattern formation method, the liquid can be water or an acidic solution.

In this case, the acidic solution can be a cesium sulfate ($Cs_2SO_4$) aqueous solution or a phosphoric acid ($H_3PO_4$) aqueous solution. It is noted that the immersion liquid may include an additive such as a surface active agent.

In the first or second pattern formation method, the exposing light can be ArF excimer laser, KrF excimer laser, $Xe_2$ laser, $F_2$ laser, KrAr laser or $Ar_2$ laser.

At this point, in the barrier film material of this invention and the material for the barrier film used in the first or second pattern formation method of this invention, the allowable range of the amount of the compound, whose alkali-insoluble property is changed to an alkali-soluble property through the molecular structure change caused by an alkaline solution, to be added to the base polymer of the barrier film is from an amount for exhibiting an effect of the addition to an amount not for degrading the film quality of the barrier film. Specifically, the amount to be added is not less than 0.1 wt % and not more than 50 wt % and preferably not less than 10 wt % and not more than 30 wt %.

As described so far, according to the barrier film material and the pattern formation method using the same of this invention, a barrier film provided between a resist film and an immersion liquid can be sufficiently dissolved in a developer such as an alkaline solution to be removed. Therefore, the resist film can be uniformly developed after removing the barrier film, and hence, a fine pattern can be formed in a good shape.

DETAILED DESCRIPTION OF THE INVENTION

Embodiment 1

A pattern formation method using a barrier film material according to Embodiment 1 of the invention will now be described with reference to FIGS. 1A through 1D, 2A and 2B.

Figure 1A:
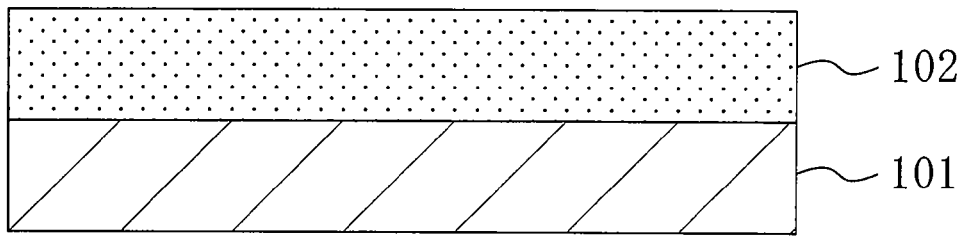
FIGS. 1A, 1B, 1C and 1D are cross-sectional views for showing procedures in a pattern formation method using a barrier film material according to Embodiment 1 of the invention.

First, a resist material having, for example, the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.05 g Quencher: triethanolamine . . . 0.002 g Solvent: propylene glycol monomethyl ether acetate . . . 20 g Next, as shown in FIG. 1A, the aforementioned resist material is applied on a substrate 101 so as to form a resist film 102 with a thickness of 0.35 μm.

Figure 1B:
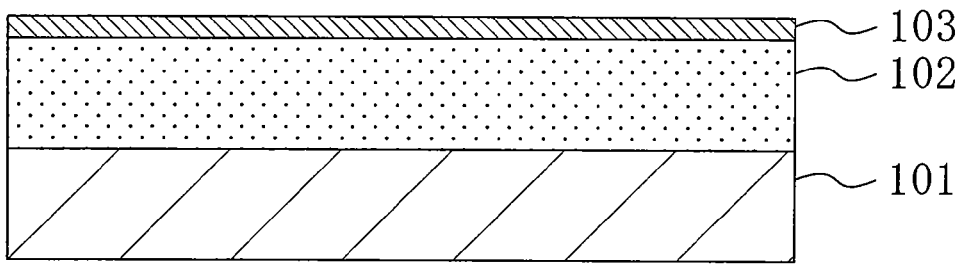

Then, as shown in FIG. 1B, by using a barrier film material having the following composition, a barrier film 103 having a thickness of 0.1 μm is formed on the resist film 102 by, for example, spin coating:

Base polymer: polyvinyl hexafluoroisopropyl alcohol . . . 1 g

Figure 1C:
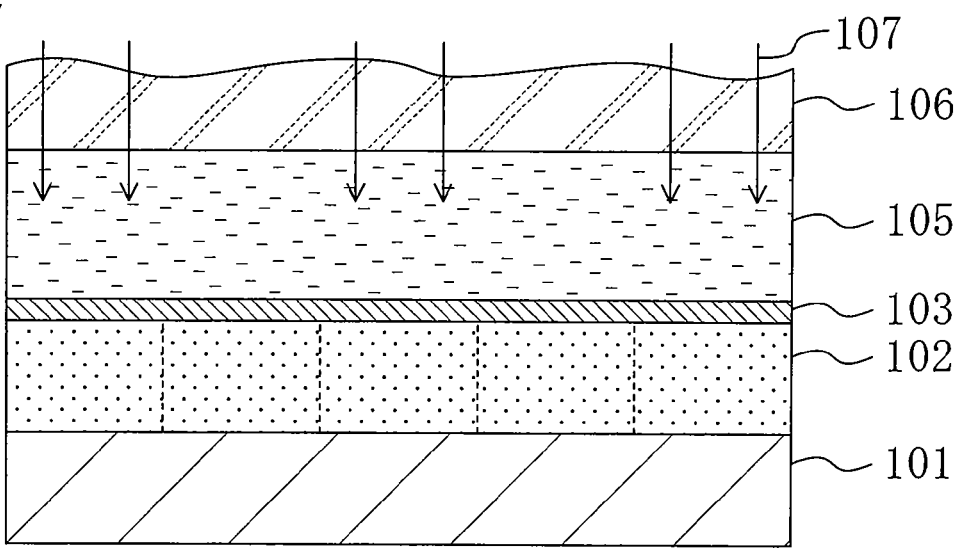

Compound whose alkali-insoluble property is changed to an alkali-soluble property through molecular structure change: γ-butyrolactone . . . 0.2 g Solvent: n-butyl alcohol . . . 20 g Then, as shown in FIG. 1C, with an immersion liquid 105 of water provided between the barrier film 103 and a projection lens 106 by, for example, a puddle method, pattern exposure is carried out by irradiating the resist film 102 through the barrier film 103 with exposing light 107 of ArF excimer laser with NA of 0.68 having passed through a mask (not shown).

Figure 1D:
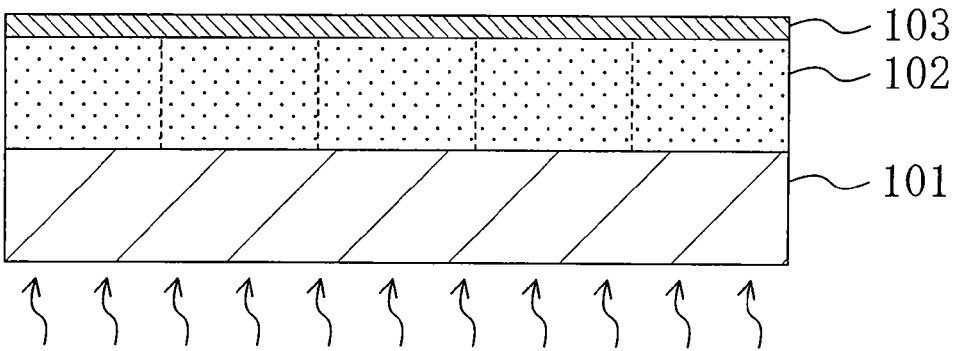

After the pattern exposure, as shown in FIG. 1D, the resist film 102 is baked with a hot plate at a temperature of 105° C. for 60 seconds (post exposure bake).

Figure 2A:
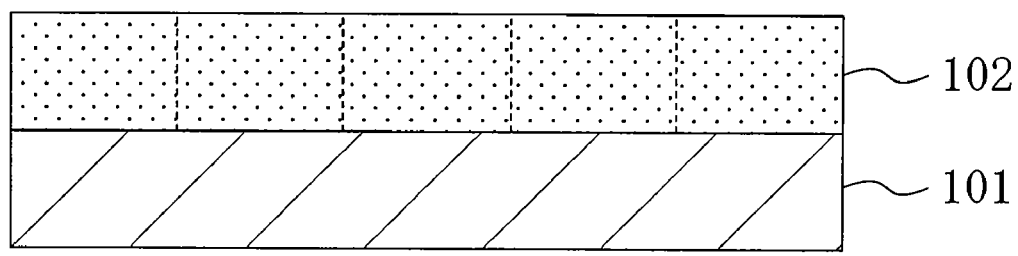
FIGS. 2A and 2B are cross-sectional views for showing other procedures in the pattern formation method using the barrier film material of Embodiment 1.
Figure 2B:
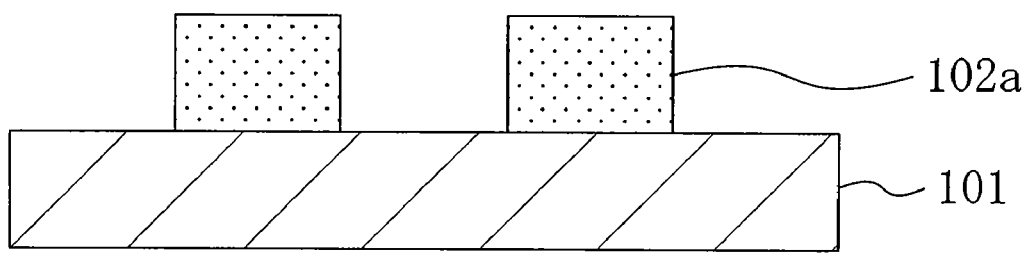

Next, as shown in FIG. 2A, the barrier film 103 is removed by using, for example, a 0.005 wt % tetramethylammonium hydroxide aqueous solution (a diluted alkaline developer), and thereafter, the resultant resist film 102 is developed with a 2.38 wt % tetramethylammonium hydroxide developer (an alkaline developer). In this manner, a resist pattern 102a made of an unexposed portion of the resist film 102 and having a line width of 0.09 μm is formed in a good shape as shown in FIG. 2B.

In this manner, since the barrier film 103 including the compound whose alkali-insoluble property is changed to an alkali-soluble property through the molecular structure change caused by an alkaline solution is formed on the resist film 102 before the pattern exposure shown in FIG. 1C in this embodiment, the barrier film 103 keeps its alkali-insoluble property before the alkali development because its molecular structure is not changed yet, and hence, the water used as the immersion liquid 105 is prevented from permeating. On the other hand, this compound is changed to be alkali-soluble because its molecular structure is changed during the alkali development, and hence, the alkali-soluble property of the barrier film 103 is improved. As a result, the resist pattern 102a made of the resist film 102 can be formed in a good shape.

Embodiment 1 is characterized by that the compound included in the barrier film material and changed to be alkali-soluble by an alkaline solution through the molecular structure change has an ester structure. Although γ-butyrolactone is used as the compound having the ester structure in Embodiment 1, δ-valerolactone, δ-pentalactone, ε-caprolactone, mevalonic lactone or the like may be used instead.

Furthermore, although polyvinyl hexafluoroisopropyl alcohol is used as the base polymer of the barrier film material, polyacrylic acid, polyvinyl alcohol or the like may be used instead.

Embodiment 2

A pattern formation method using a barrier film material according to Embodiment 2 of the invention will now be described with reference to FIGS. 3A through 3D and 4A through 4C.

Figure 3A:
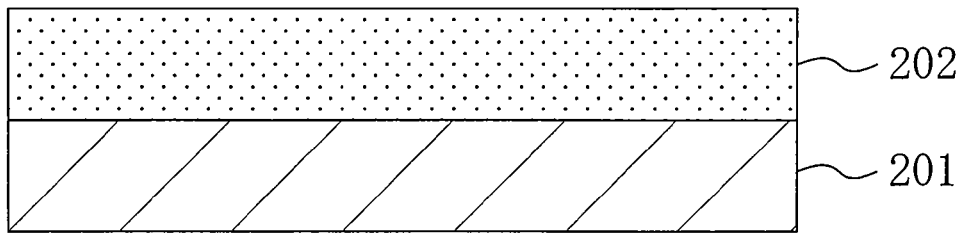
FIGS. 3A, 3B, 3C and 3D are cross-sectional views for showing procedures in a pattern formation method using a barrier film material according to Embodiment 2 of the invention.

First, a resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.05 g Quencher: triethanolamine . . . 0.002 g Solvent: propylene glycol monomethyl ether acetate . . . 20 g Next, as shown in FIG. 3A, the aforementioned resist material is applied on a substrate 201 so as to form a resist film 202 with a thickness of 0.35 μm.

Figure 3B:
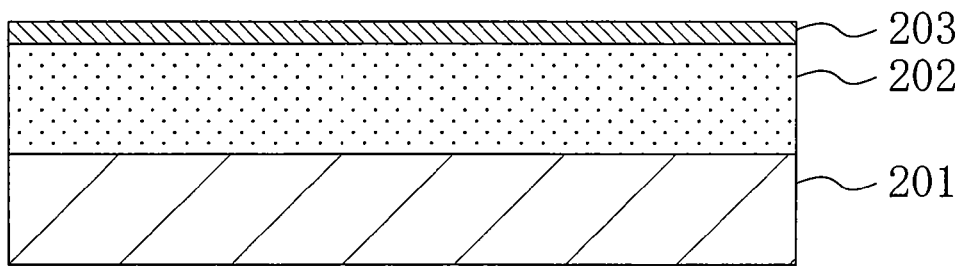

Then, as shown in FIG. 3B, by using a barrier film material having the following composition, a barrier film 203 having a thickness of 0.07 μm is formed on the resist film 202 by, for example, the spin coating:

Base polymer: polyacrylic acid . . . 1 g

Figure 3C:
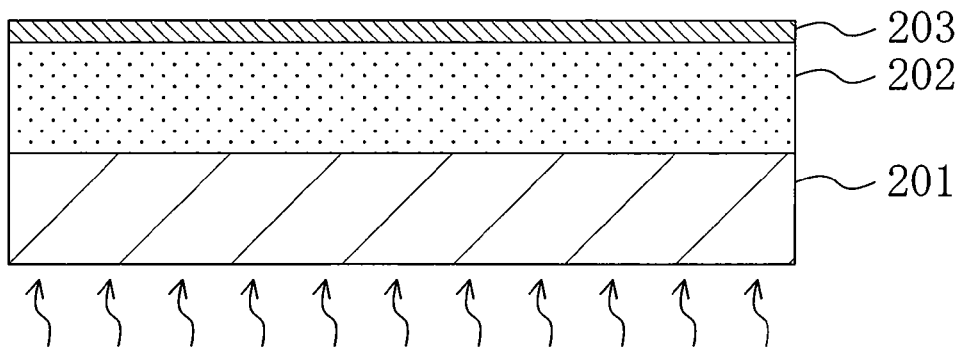

Compound whose alkali-insoluble property is changed to an alkali-soluble property through molecular structure change: δ-pentalactone . . . 0.15 g Solvent: n-butyl alcohol . . . 20 g Next, as shown in FIG. 3C, the resultant barrier film 203 is annealed with a hot plate at a temperature of 120° C. for 90 seconds, so as to improve the denseness of the barrier film 203.

Figure 3D:
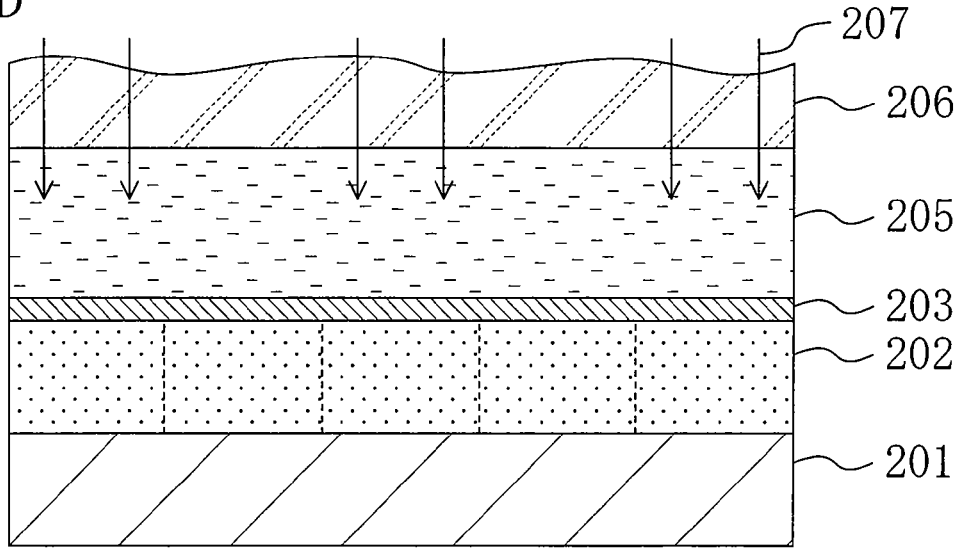

Thereafter, as shown in FIG. 3D, with an immersion liquid 205 of water provided between the barrier film 203 and a projection lens 206 by, for example, the puddle method, pattern exposure is carried out by irradiating the resist film 202 through the barrier film 203 with exposing light 207 of ArF excimer laser with NA of 0.68 having passed through a mask (not shown).

Figure 4A:
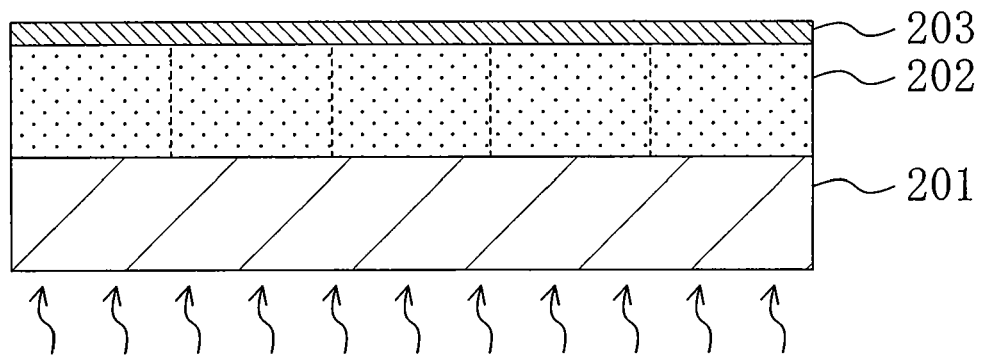
FIGS. 4A, 4B and 4C are cross-sectional views for showing other procedures in the pattern formation method using the barrier film material of Embodiment 2.

After the pattern exposure, as shown in FIG. 4A, the resist film 202 is baked with a hot plate at a temperature of 105° C. for 60 seconds (post exposure bake).

Figure 4B:
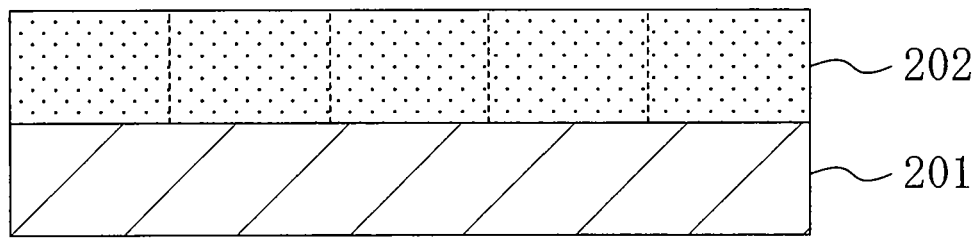
Figure 4C:
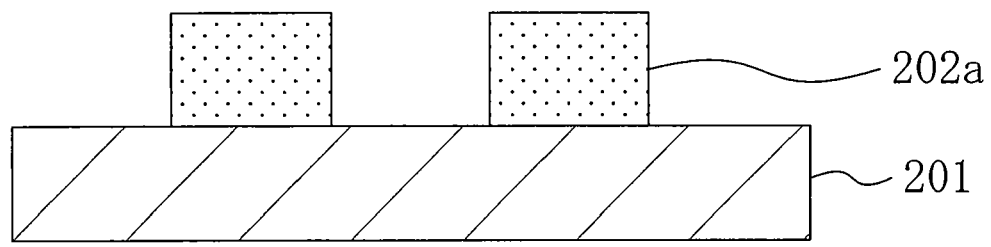

Next, as shown in FIG. 4B, the barrier film 203 is removed by using a 0.005 wt % tetramethylammonium hydroxide aqueous solution (a diluted alkaline developer), and then, the resultant resist film 202 is developed with a 2.38 wt % tetramethylammonium hydroxide aqueous solution (an alkaline developer). In this manner, a resist pattern 202a made of an unexposed portion of the resist film 202 and having a line width of 0.09 μm is formed in a good shape as shown in FIG. 4C.

In this manner, since the barrier film 203 including the compound whose alkali-insoluble property is changed to an alkali-soluble property through the molecular structure change caused by an alkaline solution is formed on the resist film 202 before the pattern exposure shown in FIG. 3D in this embodiment, the barrier film 203 keeps its alkali-insoluble property before the alkali development because its molecular structure is not changed yet, and hence, the water used as the immersion liquid 205 is prevented from permeating. On the other hand, this compound is changed to be alkali-soluble because its molecular structure is changed during the alkali development, and hence, the alkali-soluble property of the barrier film 203 is improved. As a result, the resist pattern 202a made of the resist film 202 can be formed in a good shape.

Moreover, in Embodiment 2, the barrier film 203 is annealed for improving its denseness before the pattern exposure as shown in FIG. 3C, and hence, the insoluble property of the barrier film 203 in the immersion liquid 205 is improved. Therefore, the essential function of the barrier film 203 to prevent the acid generator or the like from eluting from the resist film 202 into the immersion liquid 205 can be improved.

Embodiment 2 is characterized by that the compound included in the barrier film material and changed to be alkali-soluble by an alkaline solution through the molecular structure change has an ester structure. Although δ-pentalactone is used as the compound having the ester structure in Embodiment 2, γ-butyrolactone, δ-valerolactone, δ-caprolactone, mevalonic lactone or the like may be used instead.

Furthermore, although polyacrylic acid is used as the base polymer of the barrier film material, polyvinyl alcohol, polyvinyl hexafluoroisopropyl alcohol or the like may be used instead.

Embodiment 3

A pattern formation method using a barrier film material according to Embodiment 3 of the invention will now be described with reference to FIGS. 5A through 5D, 6A and 6B.

Figure 5A:
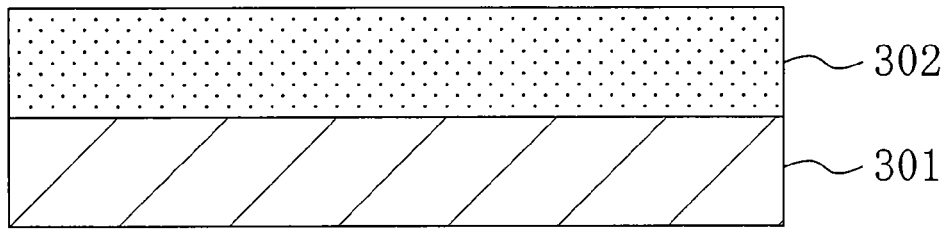
FIGS. 5A, 5B, 5C and 5D are cross-sectional views for showing procedures in a pattern formation method using a barrier film material according to Embodiment 3 of the invention.

First, a resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.05 g Quencher: triethanolamine . . . 0.002 g Solvent: propylene glycol monomethyl ether acetate . . . 20 g Next, as shown in FIG. 5A, the aforementioned resist material is applied on a substrate 301 so as to form a resist film 302 with a thickness of 0.35 μm.

Figure 5B:
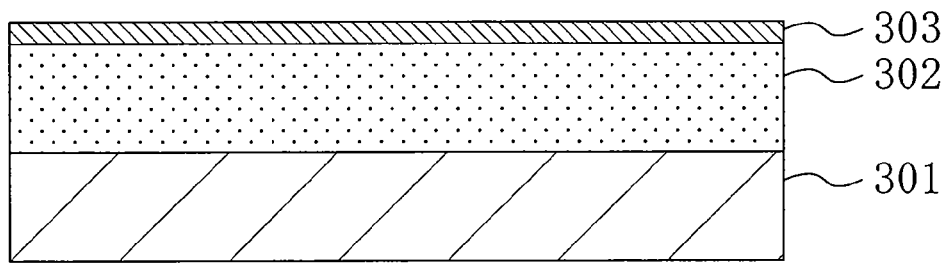

Then, as shown in FIG. 5B, by using a barrier film material having the following composition, a barrier film 303 having a thickness of 0.09 μm is formed on the resist film 302 by, for example, the spin coating:

Base polymer: polyvinyl hexafluoroisopropyl alcohol . . . 1 g

Figure 5C:
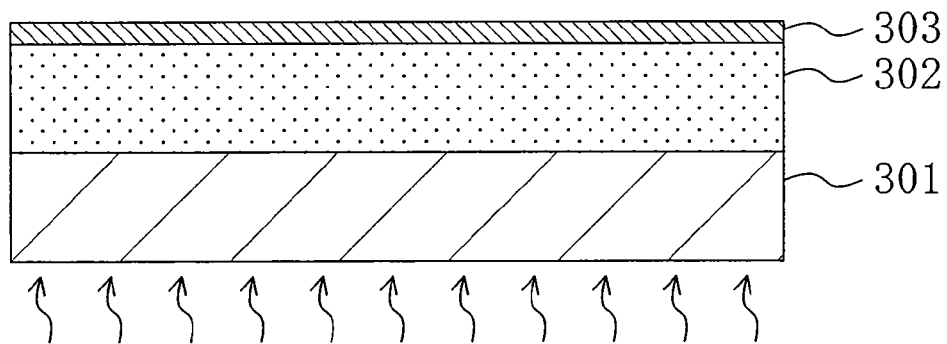

Compound whose alkali-insoluble property is changed to an alkali-soluble property through molecular structure change: γ-butyrolactone . . . 0.2 g Solvent: n-butyl alcohol . . . 20 g Thereafter, as shown in FIG. 5C, the resultant barrier film 303 is annealed with a hot plate at a temperature of 120° C. for 90 seconds, so as to improve the denseness of the barrier film 303.

Figure 5D:
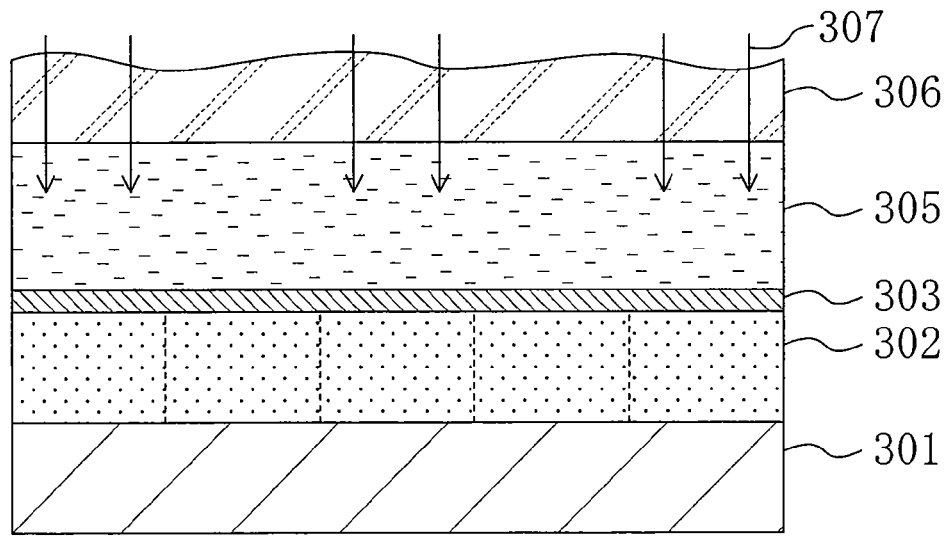

Then, as shown in FIG. 5D, with an immersion liquid 305 of water provided between the barrier film 303 and a projection lens 306 by, for example, the puddle method, pattern exposure is carried out by irradiating the resist film 302 through the barrier film 303 with exposing light 307 of ArF excimer laser with NA of 0.68 having passed through a mask (not shown).

Figure 6A:
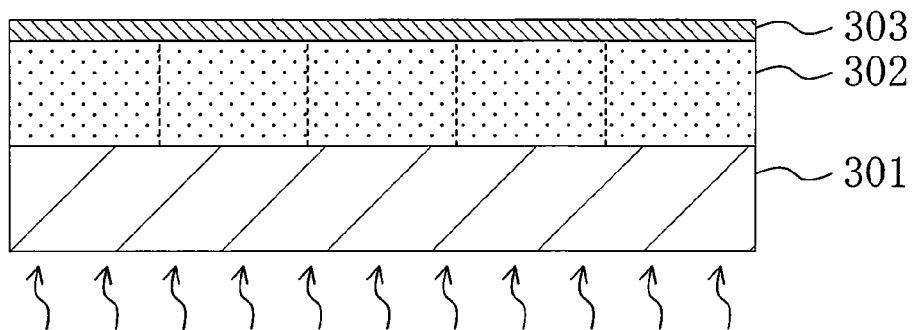
FIGS. 6A and 6B are cross-sectional views for showing other procedures in the pattern formation method using the barrier film material of Embodiment 3.

After the pattern exposure, as shown in FIG. 6A, the resist film 302 is baked with a hot plate at a temperature of 105° C. for 60 seconds (post exposure bake).

Figure 6B:
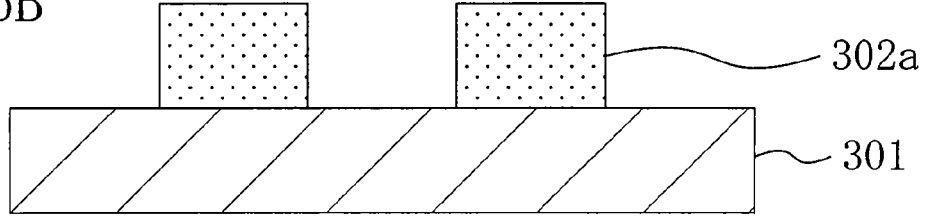

Next, the barrier film 303 is removed and the resultant resist film 302 is developed by using a 2.38 wt % tetramethylammonium hydroxide aqueous solution (an alkaline developer). In this manner, a resist pattern 302a made of an unexposed portion of the resist film 302 and having a line width of 0.09 μm is formed in a good shape as shown in FIG. 6B.

In this manner, since the barrier film 303 including the compound whose alkali-insoluble property is changed to an alkali-soluble property through the molecular structure change caused by an alkaline solution is formed on the resist film 302 before the pattern exposure shown in FIG. 5D in this embodiment, the barrier film 303 keeps its alkali-insoluble property before the alkali development because its molecular structure is not changed yet, and hence the water used as the immersion liquid 305 is prevented from permeating. On the other hand, this compound is changed to be alkali-soluble because its molecular structure is changed during the alkali development, and hence, the alkali-soluble property of the barrier film 303 is improved. As a result, the resist pattern 302a made of the resist film 302 can be formed in a good shape.

Moreover, in Embodiment 3, the barrier film 303 is annealed for improving its denseness before the pattern exposure as shown in FIG. 5C, and hence, the insoluble property of the barrier film 303 in the immersion liquid 305 is improved. Therefore, the essential function of the barrier film 303 to prevent the acid generator or the like from eluting from the resist film 302 into the immersion liquid 305 can be improved.

Embodiment 3 is characterized by that the compound included in the barrier film material and changed to be alkali-soluble by an alkaline solution through the molecular structure change has an ester structure. Although γ-butyrolactone is used as the compound having the ester structure in Embodiment 3, δ-valerolactone, δ-pentalactone, ε-caprolactone, mevalonic lactone or the like may be used instead.

Furthermore, although polyvinyl hexafluoroisopropyl alcohol is used as the base polymer of the barrier film material, polyvinyl alcohol, polyacrylic acid or the like may be used instead.

In the pattern formation method of Embodiment 3, the barrier film 303 is removed by using the alkaline developer during the development differently from Embodiments 1 and 2. Thus, the dissolution characteristic of the resist film 302 can be controlled. The control of the dissolution characteristic will now be described with reference to the drawing.

Figure 7:
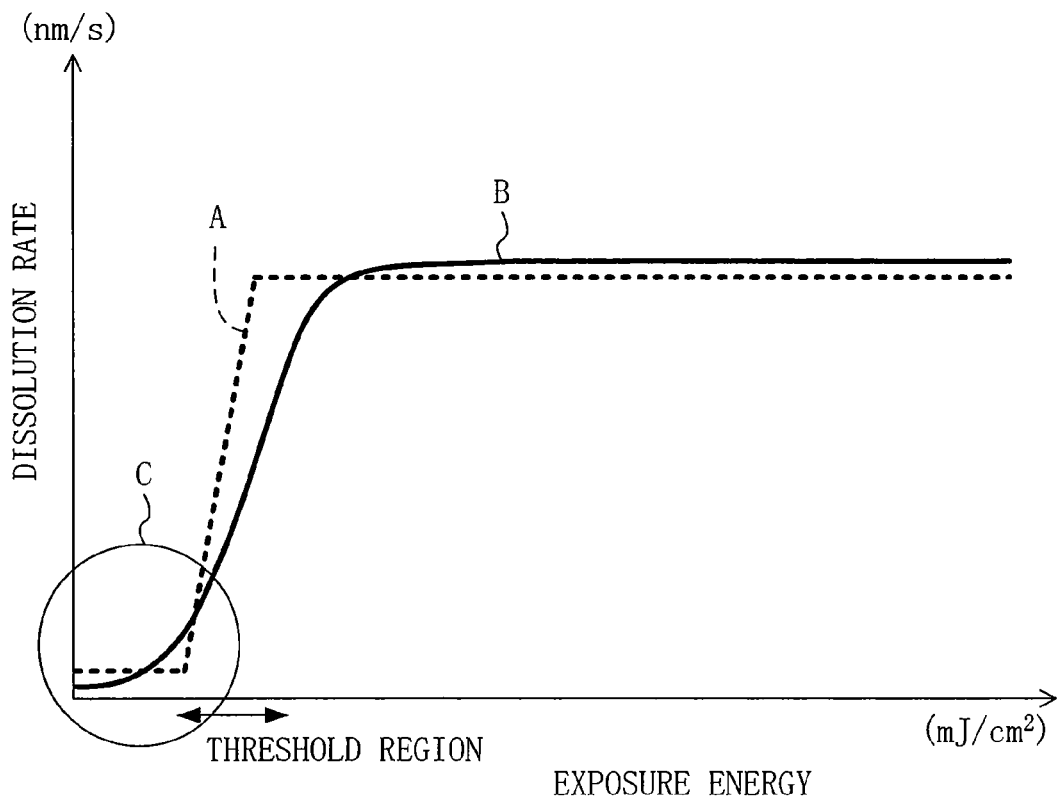
FIG. 7 is a graph for explaining control of solubility of a resist in the pattern formation method using the barrier film material of Embodiment 3.

In general, when the dissolution characteristic of a resist film in a developer is high, the dissolution rate is abruptly increased when exposure exceeds a given threshold value as shown with a graph A of a broken line in FIG. 7. As the change of the dissolution rate against the exposure is more abrupt, a difference in the solubility between an exposed portion and an unexposed portion of the resist film 302 is larger, and hence, the resist pattern 302a can attain higher resolution, namely, can be formed in a better shape. Accordingly, in the case where the barrier film 303 is removed simultaneously with the development, the dissolution rate is wholly lowered during the removal of the barrier film 303 as shown with a graph B of a solid line in FIG. 7, and hence, the change in a portion surrounded with a circle C of the graph B can be made flatter to be closer to the flat graph A. As a result, in the case where the actual resist film has the dissolution characteristic as shown with the graph B, the dissolution rate attained with smaller exposure can be adjusted to attain a comparatively constant solution state with a low dissolution rate even if the small exposure is varied to some extent. Accordingly, the difference in the solubility between an exposed portion and an unexposed portion of the resist film 302 can be substantially increased, resulting in easily forming the resist pattern in a good shape.

Embodiment 4

A pattern formation method using a barrier film material according to Embodiment 4 of the invention will now be described with reference to FIGS. 8A through 8D, 9A and 9B.

Figure 8A:
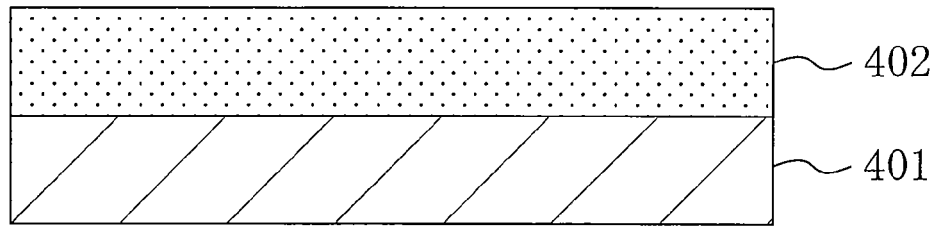
FIGS. 8A, 8B, 8C and 8D are cross-sectional views for showing procedures in a pattern formation method using a barrier film material according to Embodiment 4 of the invention.

First, a resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.05 g Quencher: triethanolamine . . . 0.002 g Solvent: propylene glycol monomethyl ether acetate . . . 20 g Next, as shown in FIG. 8A, the aforementioned resist material is applied on a substrate 401 so as to form a resist film 402 with a thickness of 0.35 μm.

Figure 8B:
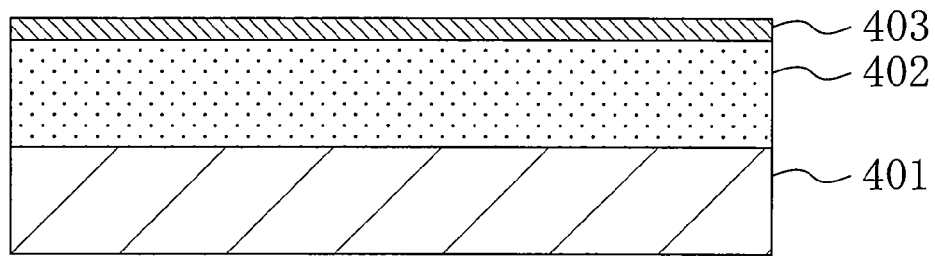

Then, as shown in FIG. 8B, by using a barrier film material having the following composition, a barrier film 403 having a thickness of 0.05 μm is formed on the resist film 402 by, for example, the spin coating:

Base polymer: polyvinyl hexafluoroisopropyl alcohol . . . 1 g

Figure 8C:
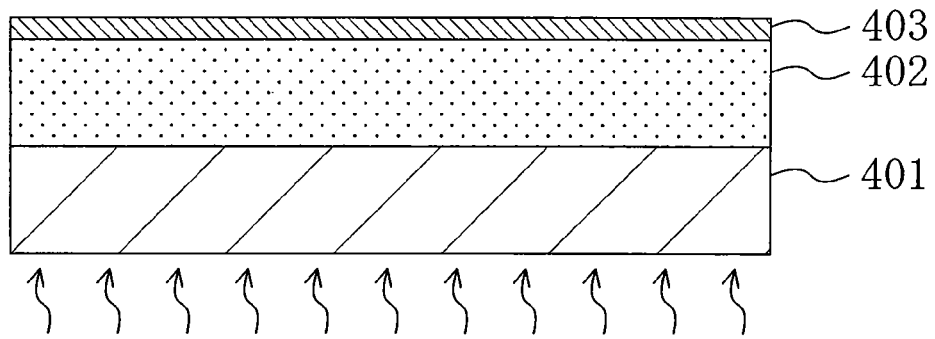

Compound whose alkali-insoluble property is changed to an alkali-soluble property through molecular structure change: γ-butyrolactone polyacrylate . . . 0.2 g Solvent: isobutyl alcohol . . . 20 g Next, as shown in FIG. 8C, the resultant barrier film 403 is annealed with a hot plate at a temperature of 120° C. for 90 seconds, so as to improve the denseness of the barrier film 403.

Figure 8D:
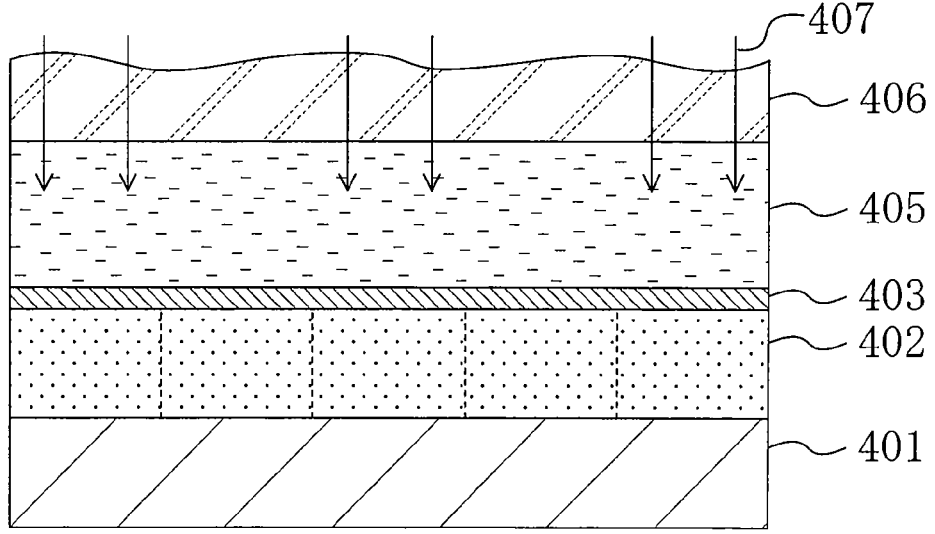

After the annealing, as shown in FIG. 8D, with an immersion liquid 405 of water provided between the barrier film 403 and a projection lens 406 by, for example, the puddle method, pattern exposure is carried out by irradiating the resist film 402 through the barrier film 403 with exposing light 407 of ArF excimer laser with NA of 0.68 having passed through a mask (not shown).

Figure 9A:
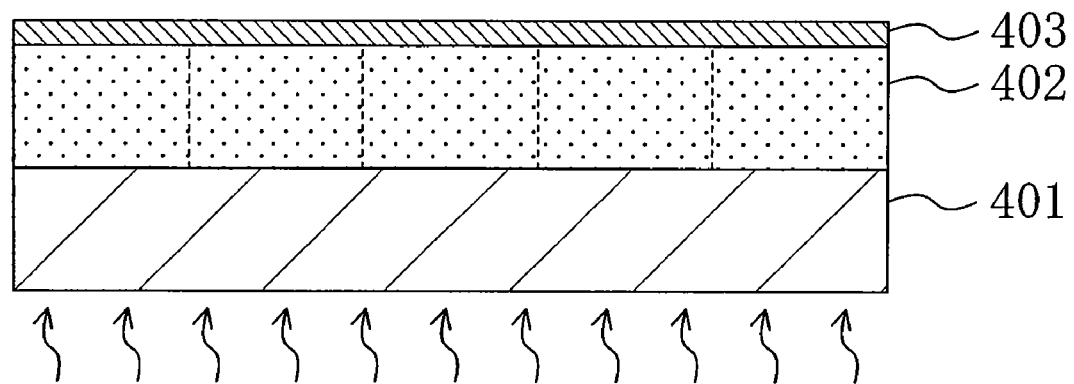
FIGS. 9A and 9B are cross-sectional views for showing other procedures in the pattern formation method using the barrier film material of Embodiment 4.

After the pattern exposure, as shown in FIG. 9A, the resist film 402 is baked with a hot plate at a temperature of 105° C. for 60 seconds (post exposure bake).

Figure 9B:
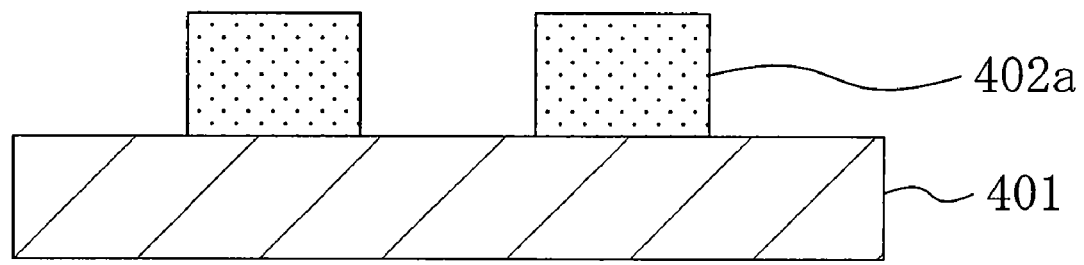

Next, the barrier film 403 is removed and the resultant resist film 402 is developed with a 2.38 wt % tetramethylammonium hydroxide aqueous solution (an alkaline developer). In this manner, a resist pattern 402a made of an unexposed portion of the resist film 402 and having a line width of 0.09 μm is formed in a good shape as shown in FIG. 9B.

In this manner, since the barrier film 403 including the polymer whose alkali-insoluble property is changed to an alkali-soluble property through the molecular structure change caused by an alkaline solution is formed on the resist film 402 before the pattern exposure shown in FIG. 8D in this embodiment, the barrier film 403 keeps its alkali-insoluble property before the alkali development because its molecular structure is not changed yet, and hence, the water used as the immersion liquid 405 can be prevented from permeating. On the other hand, this polymer is changed to be alkali-soluble because its molecular structure is changed during the alkali development, and hence, the alkali-soluble property of the barrier film 403 is improved. As a result, the resist pattern 402a made of the resist film 402 can be formed in a good shape.

Moreover, in Embodiment 4, the barrier film 403 is annealed for improving its denseness before the pattern exposure as shown in FIG. 8C, and hence, the insoluble property of the barrier film 403 in the immersion liquid 405 is improved. Therefore, the essential function of the barrier film 403 to prevent the acid generator or the like from eluting from the resist film 402 into the immersion liquid 405 can be improved.

Embodiment 4 is characterized by that the polymer included in the barrier film material and changed to be alkali-soluble by an alkaline solution through the molecular structure change has an ester structure. Although γ-butyrolactone polyacrylate is used as the polymer having the ester structure in Embodiment 4, δ-valerolactone polymethacrylate, δ-pentalactone polymethacrylate, ε-caprolactone polymethacrylate, mevalonic lactone polyacrylate or the like may be used instead.

Furthermore, although polyvinyl hexafluoroisopropyl alcohol is used as the base polymer of the barrier film material, polyacrylic acid, polyvinyl alcohol or the like may be used instead.

In the pattern formation method of Embodiment 4, the polymer is used in the barrier film 403 as the compound whose alkali-insoluble property is changed to an alkali-soluble property through the molecular structure change differently from Embodiments 1 through 3. When the polymer having a repeating unit is used as the compound changed to be alkali-soluble by an alkaline solution through the molecular structure change, the permeation of the water can be prevented by the whole barrier film and the alkali-soluble property can be higher as compared with the case where a compound not having a repeating unit is used. When a compound not having a repeating unit is used, the compound is interspersed in the barrier film. On the contrary, when a polymer having a repeating unit is used, the polymer is present as a mass in the barrier film. As a result, the hydrophobic property can be more largely improved by using, as the compound changed to be alkali-soluble by an alkaline solution through the molecular structure change, a polymer having a repeating unit than by using a compound not having a repeating unit. Also, when the polymer is used, since the polymer is present as a mass in the barrier film, the polymer can be dissolved in an alkaline solution at once. As a result, the alkali-soluble property can be improved. On the contrary, when a compound not having a repeating unit is used, since the compound is dissolved in an alkaline solution in a scattered manner in the barrier film, the alkali-soluble property of the barrier film is not largely improved as in using the polymer. Accordingly, the resist film can be more uniformly developed through the development using an alkaline solution when the polymer is used in the barrier film material as the compound changed to be alkali-soluble by an alkaline solution through the molecular structure change, and therefore, a resist pattern can be more definitely formed in a good shape.

In the pattern formation method of Embodiment 4, the barrier film 403 is removed by using the alkaline developer during the development in the same manner as in Embodiment 3. Thus, the dissolution characteristic of the resist film 402 can be controlled as described above. As a result, a difference in the soluble property between an exposed portion and an unexposed portion of the resist film 402 can be substantially increased, so that the resist pattern 402a can be more easily formed in a good shape.

Embodiment 5

A pattern formation method using a barrier film material according to Embodiment 5 of the invention will now be described with reference to FIGS. 10A through 10D and 11A through 11C.

Figure 10A:
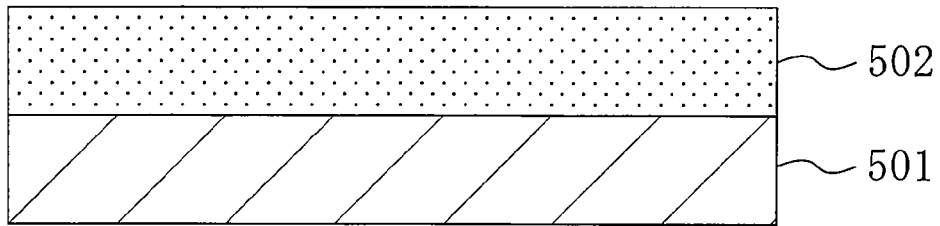
FIGS. 10A, 10B, 10C and 10D are cross-sectional views for showing procedures in a pattern formation method using a barrier film material according to Embodiment 5 of the invention.

First, a resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.05 g Quencher: triethanolamine . . . 0.002 g Solvent: propylene glycol monomethyl ether acetate . . . 20 g Next, as shown in FIG. 10A, the aforementioned resist material is applied on a substrate 501 so as to form a resist film 502 with a thickness of 0.35 μm.

Figure 10B:
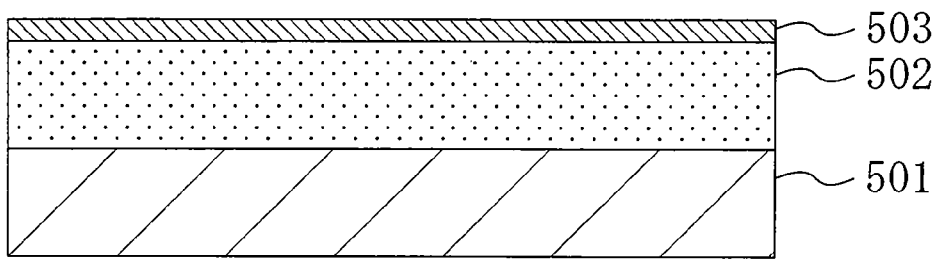

Then, as shown in FIG. 10B, by using a barrier film material having the following composition, a barrier film 503 having a thickness of 0.12 μm is formed on the resist film 502 by, for example, the spin coating:

Base polymer and polymer whose alkali-insoluble property is changed to an alkali-soluble property through molecular structure change:

δ-pentalactone polymethacrylate . . . 1 g

Solvent: n-butyl alcohol . . . 20 g

Figure 10C:
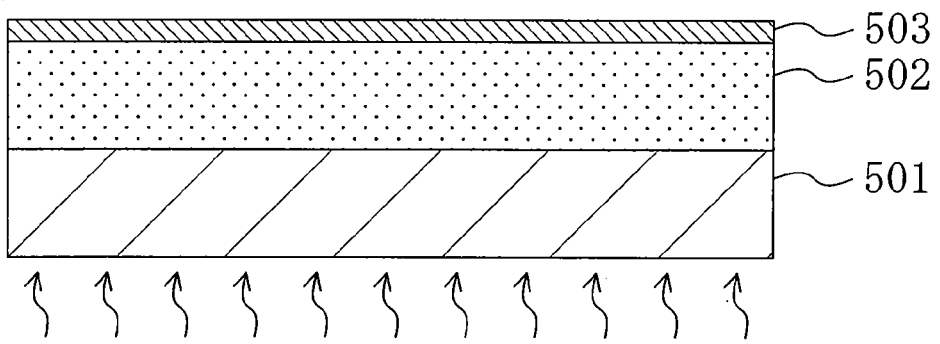

Next, as shown in FIG. 10C, the resultant barrier film 503 is annealed with a hot plate at a temperature of 120° C. for 90 seconds, so as to improve the denseness of the barrier film 503.

Figure 10D:
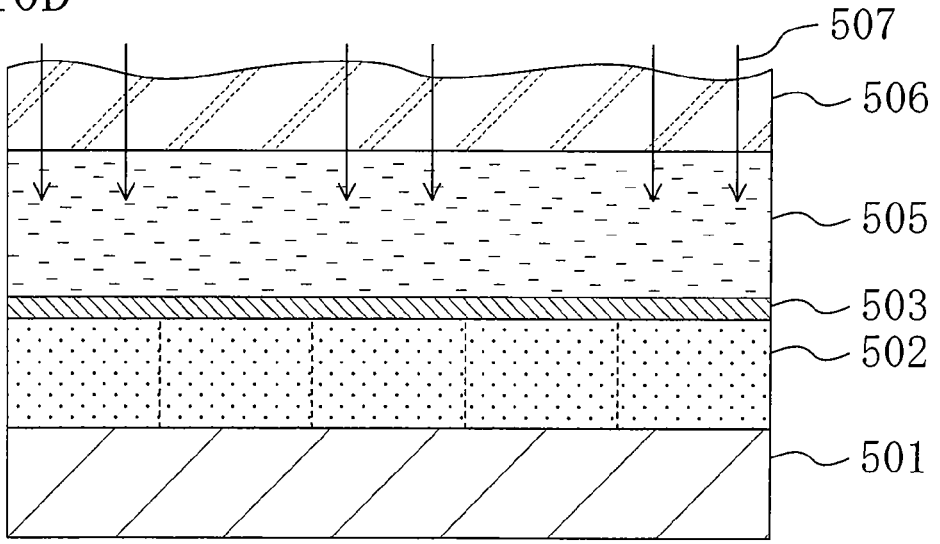

After the annealing, as shown in FIG. 10D, with an immersion liquid 505 of water provided between the barrier film 503 and a projection lens 506 by, for example, the puddle method, pattern exposure is carried out by irradiating the resist film 502 through the barrier film 503 with exposing light 507 of ArF excimer laser with NA of 0.68 having passed through a mask (not shown).

Figure 11A:
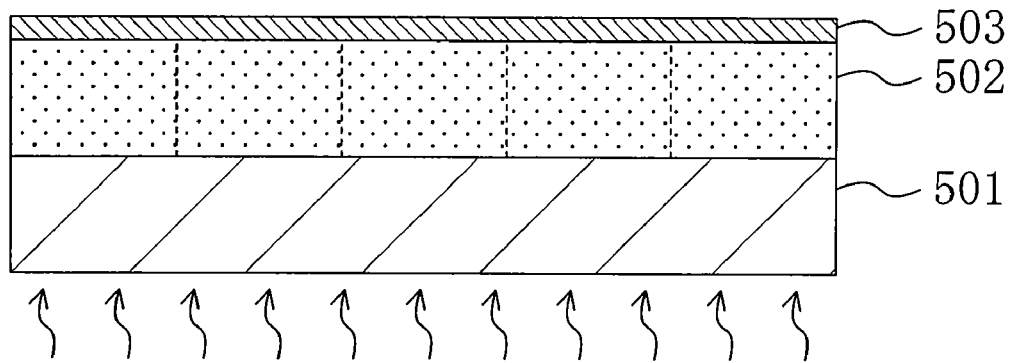
FIGS. 11A, 11B and 11C are cross-sectional views for showing other procedures in the pattern formation method using the barrier film material of Embodiment 5.

After the pattern exposure, as shown in FIG. 11A, the resist film 502 is baked with a hot plate at a temperature of 105° C. for 60 seconds (post exposure bake).

Figure 11B:
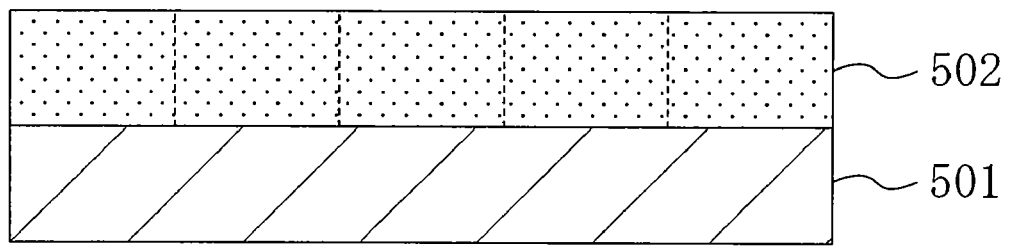
Figure 11C:
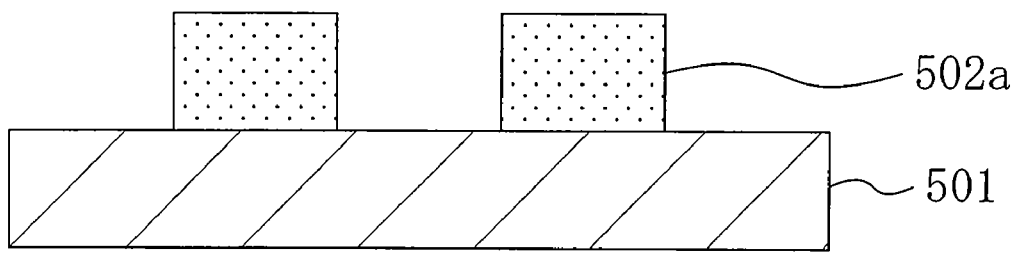
Figure 12A:
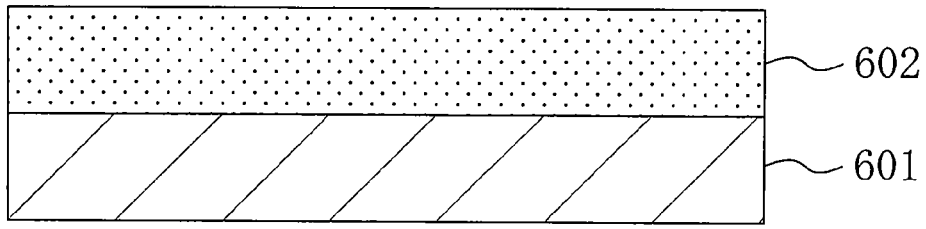
FIGS. 12A, 12B, 12C and 12D are cross-sectional views for showing procedures in a conventional pattern formation method employing immersion lithography.
Figure 12B:
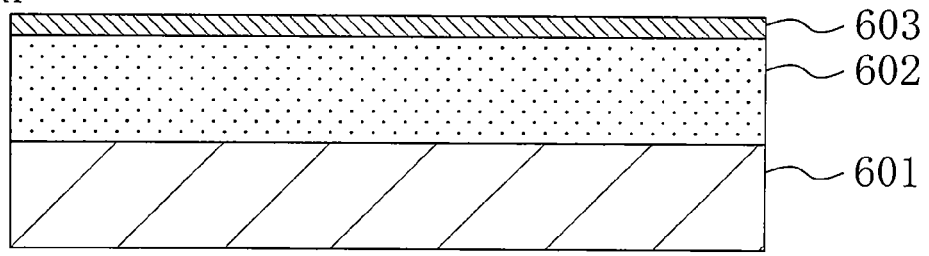
Figure 12C:
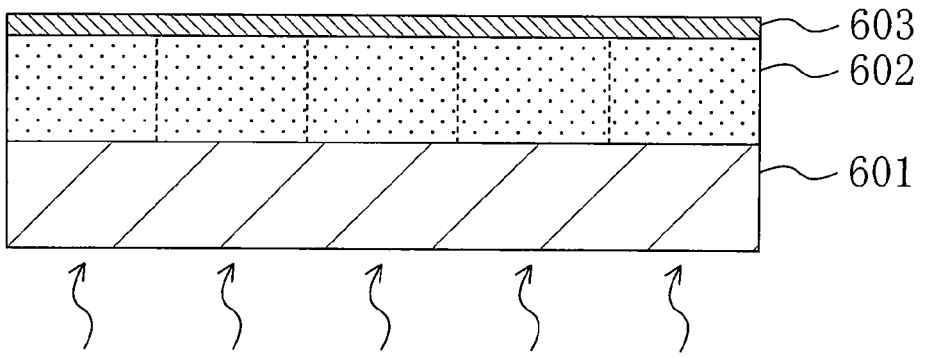
Figure 12D:
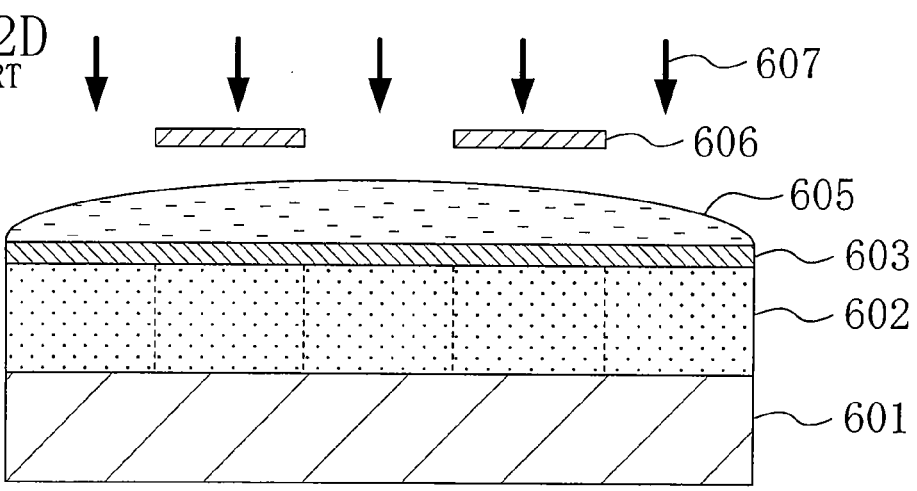
Figure 13A:
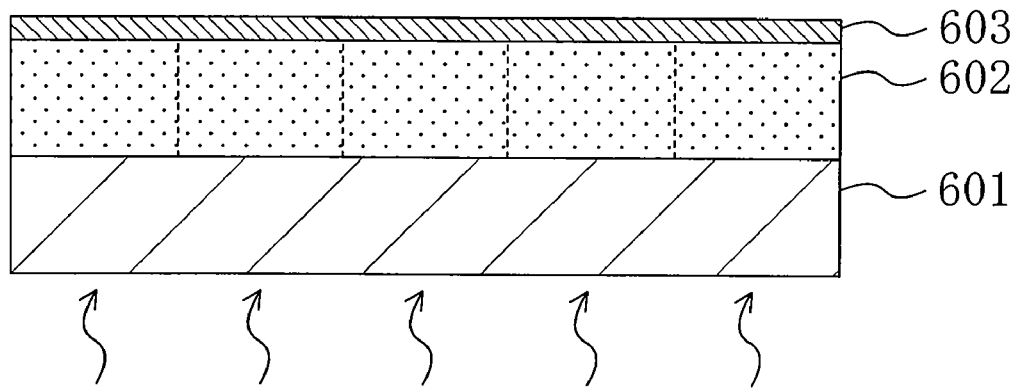
FIGS. 13A and 13B are cross-sectional views for showing other procedures in the conventional pattern formation method employing the immersion lithography.
Figure 13B:
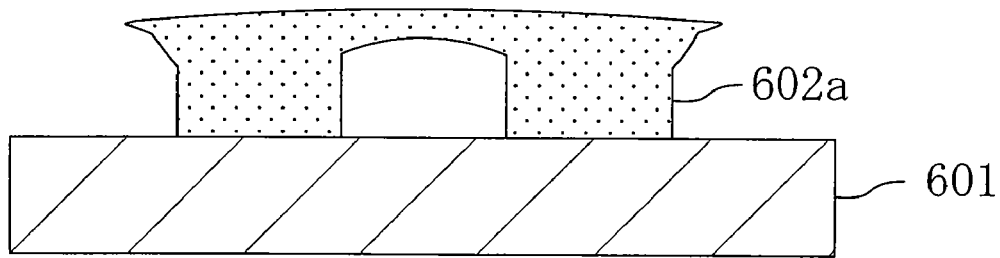

Next, as shown in FIG. 11B, the barrier film 503 is removed by using a 0.005 wt % tetramethylammonium hydroxide aqueous solution (a diluted alkaline developer), and then, the resultant resist film 502 is developed with a 2.38 wt % tetramethylammonium hydroxide aqueous solution (an alkaline developer). In this manner, a resist pattern 502a made of an unexposed portion of the resist film 502 and having a line width of 0.09 µm is formed in a good shape as shown in FIG. 11C.

In this manner, since the barrier film 503 including, as the base polymer, the polymer whose alkali-insoluble property is changed to an alkali-soluble property through the molecular structure change caused by an alkaline solution is formed on the resist film 502 before the pattern exposure shown in FIG. 10D in this embodiment, the barrier film 503 keeps its alkali-insoluble property before the alkali development because its molecular structure is not changed yet, and hence, the water can be prevented from permeating. On the other hand, this polymer is changed to be alkali-soluble because its molecular structure is changed during the alkali development, and hence, the alkali-soluble property of the barrier film 503 is improved. As a result, the resist pattern 502a made of the resist film 502 can be formed in a good shape.

Moreover, in Embodiment 5, the barrier film 503 is annealed for improving its denseness before the pattern exposure as shown in FIG. 10C, and hence, the insoluble property of the barrier film 503 in the immersion liquid 505 is improved. Therefore, the essential function of the barrier film 503 to prevent the acid generator or the like from eluting from the resist film 502 into the immersion liquid 505 can be improved.

Embodiment 5 is characterized by that the polymer (base polymer) included in the barrier film material and changed to be alkali-soluble by an alkaline solution through the molecular structure change has an ester structure. Although δ-pentalactone polymethacrylate is used as the polymer having the ester structure in Embodiment 5, γ-butyrolactone polyacrylate, δ-valerolactone polymethacrylate, δ-caprolactone polymethacrylate, mevalonic lactone polyacrylate or the like may be used instead.

Although the water is used as the immersion liquid in the pattern formation method of each of Embodiments 1 through 5, an acidic solution may be used instead. As the acidic solution, a cesium sulfate ($Cs_2SO_4$) aqueous solution, a phosphoric acid ($H_3PO_4$) aqueous solution or the like may be used, but the acidic solution is not limited to them. In using the acidic solution, the concentration of cesium sulfate or phosphoric acid is approximately 1 wt % through 10 wt %, which does not limit the invention. Also, the immersion liquid may further include an additive such as a surface active agent.

The thickness of the barrier film is not limited to approximately 0.05 µm through 0.12 µm mentioned in the respective embodiments. The lower limit of the thickness is a thickness capable of preventing a component of the resist film from eluting into the immersion liquid or preventing the immersion liquid from permeating into the resist film, and the upper limit of the thickness is a thickness that does not inhibit transmittance of the exposing light and can be easily removed. For example, the thickness is preferably 0.07 µm through 0.10 µm, which does not limit the invention.

Although the exposing light is ArF excimer laser in each of Embodiments 1 through 5, the exposing light is not limited to it but may be KrF excimer laser, $Xe_2$ laser, $F_2$ laser, KrAr laser or $Ar_2$ laser instead.

Furthermore, the puddle method is employed for providing the immersion liquid onto the barrier film in each embodiment, which does not limit the invention, and for example, a dip method in which the whole substrate is dipped in the immersion liquid may be employed instead.

Moreover, although a positive resist is used for the resist film in each embodiment, the present invention is applicable also to a negative resist.

As described so far, according to the barrier film material and the pattern formation method using the same of this invention, the influence of an immersion liquid on a resist film can be prevented and a resist pattern can be formed in a good shape. Therefore, the invention is useful as a method for forming a fine pattern to be employed in fabrication process or the like for semiconductor devices.

What is claimed is:

1. A pattern formation method comprising the steps of:
   forming a resist film on a substrate;
   forming, on the resist film, a barrier film including a compound having a lactone structure;
   performing pattern exposure by selectively irradiating the resist film through the barrier film with exposing light with a liquid provided on the barrier film;
   removing the barrier film after the pattern exposure; and
   forming a resist pattern made of the resist film by developing the resist film.

2. The pattern formation method of claim 1,
   wherein the compound having a lactone structure and included in the barrier film is a polymer.

3. The pattern formation method of claim 1,
   wherein the compound having a lactone structure is lactone.

4. The pattern formation method of claim 3,
   wherein the lactone is γ-butyrolactone, δ-valerolactone, δ-pentalactone, ε-caprolactone or mevalonic lactone.

5. The pattern formation method of claim 1,
   wherein the barrier film includes polyvinyl alcohol, polyacrylic acid or polyvinyl hexafluoroisopropyl alcohol.

6. The pattern formation method of claim 1, further comprising a step of annealing the barrier film between the step of forming a barrier film and the step of performing pattern exposure.

7. The pattern formation method of claim 1,
   wherein the liquid is water or an acidic solution.

8. The pattern formation method of claim 7,
   wherein the acidic solution is a cesium sulfate aqueous solution or a phosphoric acid aqueous solution.

9. The pattern formation method of claim 1,
   wherein the exposing light is ArF excimer laser, KrF excimer laser, $Xe_2$ laser, $F_2$ laser, KrAr laser or $Ar_2$ laser.

10. A pattern formation method comprising the steps of:
    forming a resist film on a substrate;
    forming, on the resist film, a barrier film including a compound having a lactone structure;
    performing pattern exposure by selectively irradiating the resist film through the barrier film with exposing light with a liquid provided on the barrier film; and
    removing the barrier film and forming a resist pattern made of the resist film by developing the resist film after the pattern exposure.

11. The pattern formation method of claim 10,
    wherein the compound having a lactone structure and included in the barrier film is a polymer.

12. The pattern formation method of claim 10,
wherein the compound having a lactone structure is lactone.

13. The pattern formation method of claim 12,
wherein the lactone is γ-butyrolactone, δ-valerolactone, δ-pentalactone, ε-caprolactone or mevalonic lactone.

14. The pattern formation method of claim 10,
wherein the barrier film includes polyvinyl alcohol, polyacrylic acid or polyvinyl hexafluoroisopropyl alcohol.

15. The pattern formation method of claim 10, further comprising a step of annealing the barrier film between the step of forming a barrier film and the step of performing pattern exposure.

16. The pattern formation method of claim 10,
wherein the liquid is water or an acidic solution.

17. The pattern formation method of claim 10,
wherein the exposing light is ArF excimer laser, KrF excimer laser, $Xe_2$ laser, $F_2$ laser, KrAr laser or $Ar_2$ laser.

* * * * *